United States Patent
Galera et al.

(10) Patent No.: US 8,198,132 B2
(45) Date of Patent: Jun. 12, 2012

(54) ISOLATED STACKED DIE SEMICONDUCTOR PACKAGES

(75) Inventors: Manolito Galera, Singapore (SG);
 Leocadio Morona Alabin, Singapore (SG)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/245,210

(22) Filed: Sep. 26, 2011

(65) Prior Publication Data

US 2012/0015482 A1    Jan. 19, 2012

Related U.S. Application Data

(63) Continuation of application No. 12/949,587, filed on Nov. 18, 2010, now Pat. No. 8,053,883, which is a continuation of application No. 12/178,023, filed on Jul. 23, 2008, now abandoned.

(51) Int. Cl.
*N01L 21/00* (2006.01)

(52) U.S. Cl. ........................... 438/107; 438/109

(58) Field of Classification Search ........... 438/107, 438/109, 110, 111, 123, 124, 126, 127
See application file for complete search history.

(56) References Cited

U.S. PATENT DOCUMENTS

| | | | |
|---|---|---|---|
| 5,399,898 A | 3/1995 | Rostoker | |
| 6,369,448 B1 | 4/2002 | McCormick | |
| 6,407,456 B1 | 6/2002 | Ball | |
| 6,781,849 B2 | 8/2004 | Baek et al. | |
| 6,867,500 B2 | 3/2005 | Corisis et al. | |
| 7,145,223 B2 | 12/2006 | Kunimatsu et al. | |
| 7,180,165 B2 | 2/2007 | Ellsberry et al. | |
| 7,180,166 B2 | 2/2007 | Ho et al. | |
| 7,253,026 B2 | 8/2007 | Ahn et al. | |
| 7,262,506 B2 | 8/2007 | Mess et al. | |
| 7,843,047 B2 * | 11/2010 | Kuan et al. | 257/676 |
| 7,875,964 B2 * | 1/2011 | Carney et al. | 257/673 |
| 8,043,894 B2 * | 10/2011 | Tay et al. | 438/109 |
| 8,058,716 B2 * | 11/2011 | Chye et al. | 257/686 |
| 8,080,867 B2 * | 12/2011 | Camacho et al. | 257/686 |
| 8,125,063 B2 * | 2/2012 | Wang | 257/676 |

\* cited by examiner

*Primary Examiner* — S. V. Clark

(74) *Attorney, Agent, or Firm* — Kenneth E. Horton; Kirton McConkie PC

(57) ABSTRACT

Semiconductor packages that contain isolated, stacked dies and methods for making such devices are described. The semiconductor package contains both a first die with a first integrated circuit and a second die with a second integrated circuit that is stacked onto the first die while also being isolated from the first die. The first and second dies are connected using an array of metal connectors containing both a base segment and a beam segment extending over the first die and supporting the second die. This configuration can provide a thinner semiconductor package since wire-bonding is not used. As well, since the integrated circuit devices in the first and second dies are isolated from each other, local heating and/or hot spots are diminished or prevented in the semiconductor package. Other embodiments are also described.

20 Claims, 4 Drawing Sheets

ISOLATED STACKED DIE SEMICONDUCTOR PACKAGES

CROSS-REFERENCE TO RELATED APPLICATIONS

This patent application is a continuation application of U.S. application Ser. No. 12/949,587 filed on Nov. 18, 2010 now U.S. Pat. No. 8,053,883, which is a continuation application of U.S. application Ser. No. 12/178,023, filed on Jul. 23, 2008 now abandoned, the entire disclosures of which are hereby incorporated by reference.

FIELD

This application relates generally to semiconductor devices and methods for making such devices. More specifically, this application describes semiconductor packages that contain multiple, stacked dies containing integrated circuit devices and methods for making such packages.

BACKGROUND

Semiconductor packages are well known in the art. Often, these packages may include one or more semiconductor devices, such as an integrated circuit ("IC") die or chip, which may be connected to a die pad that is centrally formed in a lead frame. In some cases, bond wires electrically connect the IC die to a series of terminals that serve as an electrical connection to an external device, such as a printed circuit board ("PCB"). An encapsulating material can be used to cover the bond wires, the IC die, the terminals, and/or other components of the semiconductor device to form the exterior of the semiconductor package. A portion of the terminals and possibly a portion of the die pad may be externally exposed from the encapsulating material. In this manner, the die may be protected from environmental hazards—such as moisture, contaminants, corrosion, and mechanical shock—while being electrically and mechanically connected to an electronic device that is external to the semiconductor package.

After it has been formed, the semiconductor package is often used in an ever growing variety of electronic applications, such as disk drives, USB controllers, portable computer devices, cellular phones, and so forth. Depending on the die and the electronic application, the semiconductor package may be highly miniaturized and may need to be as small as possible.

In most instances, each semiconductor package only contains a single die that contains the integrated circuit device, or a discrete device such as a diode or a transistor. Thus, the functionality of each semiconductor package is often limited to that discrete device or integrated circuit on the single die that it contains. To combine the functions of devices in more than a single die, two or more semiconductor packages are used.

SUMMARY

This application relates to semiconductor packages that contain isolated, stacked dies and methods for making such packages. The semiconductor package contains both a first die with a first integrated circuit and a second die with a second integrated circuit that is stacked onto the first die while also being isolated from the first die. The first and second dies are connected using an array of metal connectors containing both a base segment and a beam segment extending over the first die and supporting the second die. This configuration can provide a thinner semiconductor package since wire-bonding is not used. As well, since the integrated circuit devices in the first and second dies are isolated from each other, local heating and/or hot spots are diminished or prevented in the semiconductor package.

BRIEF DESCRIPTION OF THE DRAWINGS

The following description can be better understood in light of the Figures, in which.

Figure 1:
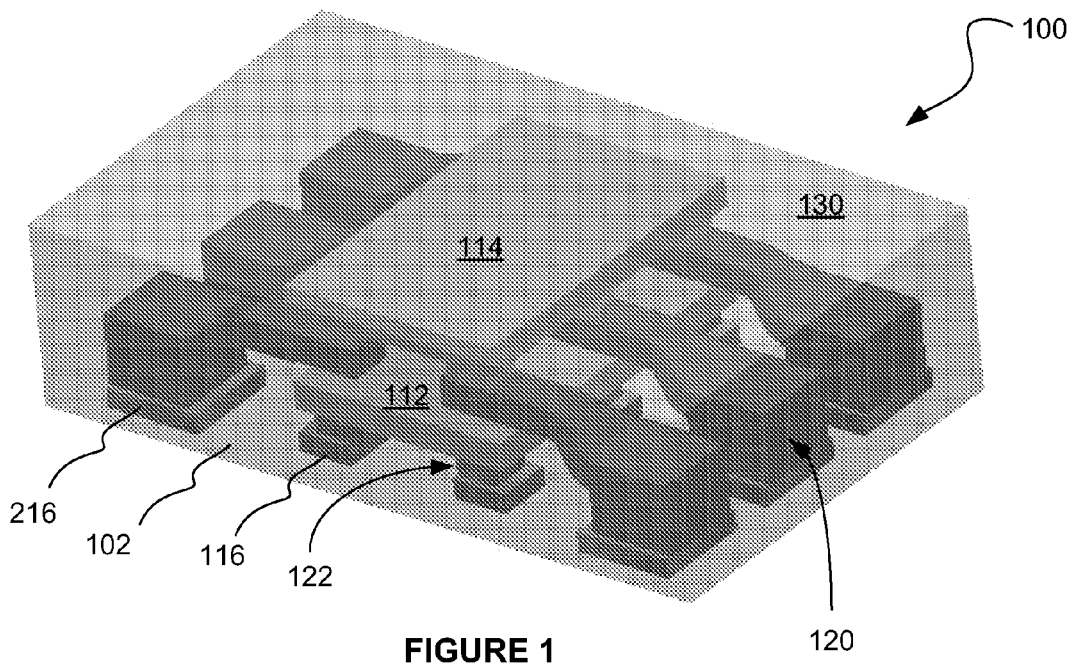
FIG. 1 shows some embodiments of a semiconductor package containing multiple dies with a molding material shown as transparent.

The Figures illustrate specific aspects of the semiconductor packages that contain multiple, stacked dies and methods for making such packages. Together with the following description, the Figures demonstrate and explain the principles of the methods and structures produced through these methods. In the drawings, the thickness of layers and regions are exaggerated for clarity. It will also be understood that when a layer, component, or substrate is referred to as being "on" another layer, component, or substrate, it can be directly on the other layer, component, or substrate, or intervening layers may also be present. The same reference numerals in different drawings represent the same element, and thus their descriptions will not be repeated.

DETAILED DESCRIPTION

The following description supplies specific details in order to provide a thorough understanding. Nevertheless, the skilled artisan would understand that the semiconductor devices and associated methods of using the devices can be implemented and used without employing these specific details. Indeed, the devices and associated methods can be placed into practice by modifying the illustrated devices and associated methods and can be used in conjunction with any other apparatus and techniques conventionally used in the industry. For example, while the description below focuses on methods for making for semiconductor devices in the IC industry, it could be used for and applied to other electronic devices like optoelectronic devices, solar cells, MEMS structures, lighting controls, power supplies, and amplifiers. As well, while the description below describes using two dies in the same semiconductor package, it could be configured to contain more than two dies, including 3 or even more dies.

Some embodiments of the semiconductor packages that contain multiple, stacked dies and methods for making such devices are shown in the Figures. In the embodiments shown in FIG. 1 (perspective view) and FIG. 2 (bottom view), the semiconductor package 100 contains a substrate 102, a plurality of terminals 106, a first die 112 containing a first IC device, a second die 114 containing a second IC device, multiple land pads (both first, inner land pads 116 and second, outer land pads 216), connectors 120, and molding material 130.

The first IC device and the second IC device may be the same or different and may be any known integrated circuit (including any discrete device) in the art. Some non-limiting examples of these devices may include logic or digital IC, linear regulators, audio power amplifiers, LDO, driver IC, diodes, and/or transistors, including zener diodes, schottky diodes, small signal diodes, bipolar junction transistors ("BJT"), metal-oxide-semiconductor field-effect transistors ("MOSFET"), insulated-gate-bipolar transistors ("IGBT"), and insulated-gate field-effect transistors ("IGFET"). In some embodiments, the first IC device comprises an audio amplifier and the second IC device comprises a low drop-out device (LDO).

The semiconductor package 100 contains a substrate 102 on which the other components of the semiconductor package are located. The substrate can be any low-cost, recyclable material such as steel, stainless steel, or any steel alloy known in the art. The substrate 102 can be configured with any shape and size consistent with its use in the semiconductor package 100. The substrate 102 can have any thickness that provides the needed support for the device. In some embodiments, such as where the substrate 102 comprises stainless steel, it may have a non-limiting thickness ranging from about 0.15 millimeters to about 0.25 millimeters.

In some embodiments, the substrate 102 has the shape illustrated in the Figures since it contains an area to which the multiple land pads are attached. In turn, the bottom of the first die 112 is then connected to the first land pads 116. Due to the overlap of the surfaces of the die attach pad area and the first die 112, the die attach pad area can act as both a thermal and/or an electrical conductor. Such a configuration also permits the land pads to dissipate the heat generated by the IC devices, increasing the efficiency of the heat dissipation from the semiconductor package 100. As described herein, the second land pads 216 can be used to bond or attach the second die 114 to the substrate 102.

Figure 2:
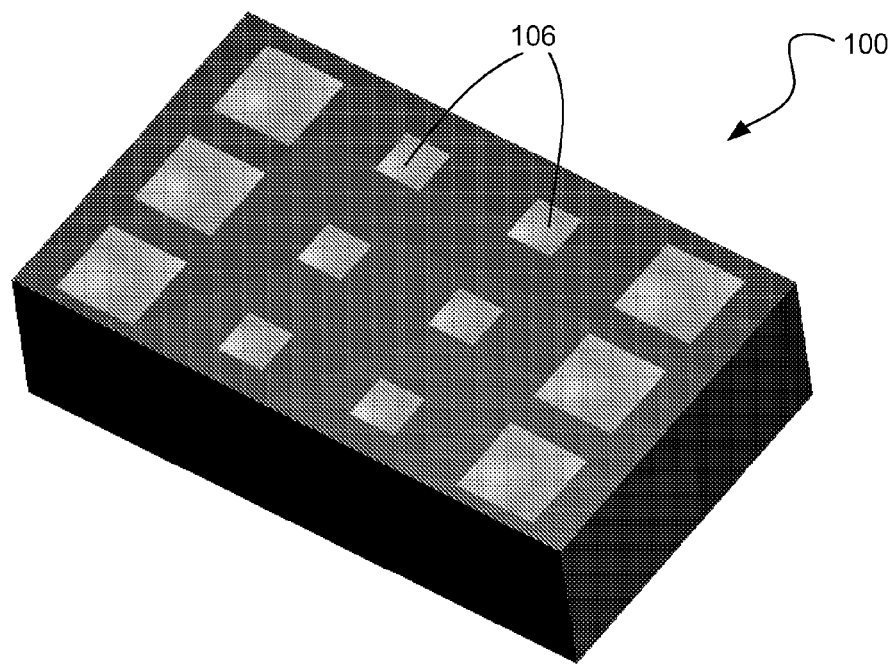
FIG. 2 shows some embodiments of a semiconductor package containing multiple dies with the molding material depicted as black.

In some embodiments, the multiple land pads can also serve as leads for the semiconductor package. In these embodiments, the substrate 102 is removed or peeled-off after molding process but with the multiple land pads retained in the molded body. Thus, the ends of the land pads serve as the terminals 106 as shown in FIG. 2. Accordingly, the lay-out of the multiple land pads and the terminals 106 can be substantially similar in these embodiments. In other embodiments, though, the multiple land pads and the terminals 106 are formed separate from each other and a redistribution layer can be used to change the lay-out from the land pads to the terminals.

In some embodiments, the multiple land pads can comprise any bond pads known in the semiconductor art. For example, the land pads could comprise a metal stud and a reflowed solder material or metal deposit like Au, Ni, Ag, or combinations of these materials.

In some configurations, the first die 112 and the second die 114 are substantially similar in size and shape. In other configurations, the second die 114 can be relatively smaller than the first die 112. In yet other configurations, the second die 114 can be slightly larger than the first die 112.

Figure 4:
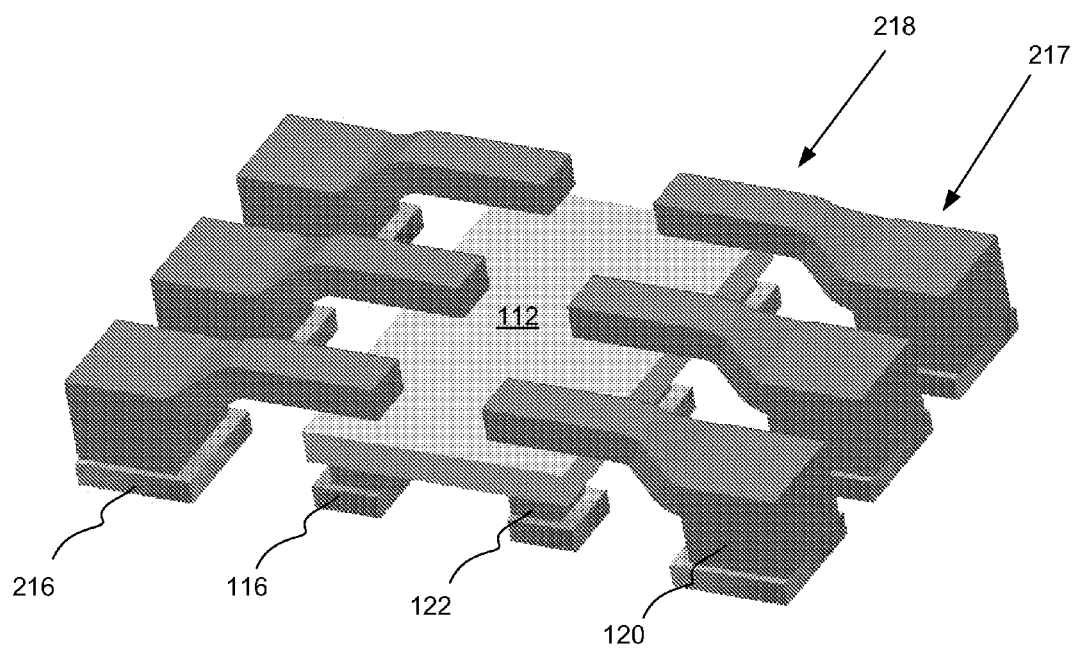
FIG. 4 illustrates some embodiments of the methods for manufacturing a semiconductor package containing connectors on the land pads.

As shown in FIG. 1, connectors 120 can be configured in some embodiments to contain a first portion (or base segment) 217 (as shown in FIG. 4) that extends upward away from the landing pads 216. Thus, this first portion is substantially similar in footprint size to the landing pad 216. The connectors 120 also contain a second portion (or beam segment) 218 (as shown in FIG. 4) that extends from the first portion 217 towards the area above the first die 112. In the embodiments depicted in FIGS. 1-2, the second portion of the connectors 120 can be given a finger-like configuration. The connectors 120 can also be given any configuration of shape and size in other embodiments provided they support the second die 114. To properly support the beam segment of the connectors 120, the second landing pads 216 can be configured to be larger than the first landing pads 116, as depicted in FIG. 1.

The connectors 120 can be used to electrically connect the second landing pads 216 to the second die 114. The connectors 120 can contain any conductive metal or metal alloy similar to standard leadframes known in the art, including Cu, Ni—Pd, Ni—Pd—Au, or Ni—Pd—Au/Ag. In some embodiments, the connectors 120 comprise Cu. The connectors can be configured to substantially match the desired connection points in the IC devices of the second die 114.

The first and second dies, the upper surface of the substrate 102, and the connectors 120 can be encapsulated in any molding material 130 known in the art, as shown in FIGS. 1 and 2. In FIG. 1, the molding material 130 is shown in phantom to better illustrate the internal components of semiconductor package 100. In some embodiments, the molding material can comprise an epoxy molding compound, a thermoset resin, a thermoplastic material, or potting material. In other embodiments, the molding material comprises an epoxy molding compound.

Figure 3:
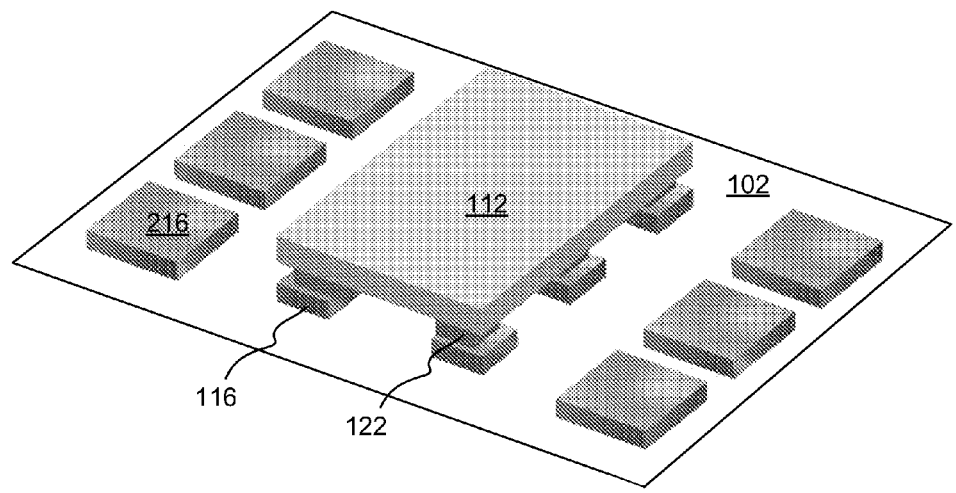
FIG. 3 depicts some embodiments of the methods for manufacturing a semiconductor package containing multiple land pads and a first die.

The semiconductor packages 100 can be made using any known process that provides the structures described above. In some embodiments, the methods described herein can be used. The method begins, as illustrated in FIG. 3, by providing the substrate 102. The substrate 102 can be provided by metal stamping or etching a frame of the desired material (i.e., stainless steel) to contain multiple lands or terminals. The substrate 102 can be peeled-off after the molding process used to form the semiconductor package.

Next, the first and second dies containing their IC devices are obtained, having been previously or substantially simultaneously manufactured using any known suitable processes. In some embodiments, the first and second IC devices can be manufactured separately. But in other embodiments, the first and second IC devices are manufactured at substantially the same time.

As shown in FIG. 3, the multiple landing pads (116 and 216) can then be formed on the substrate 102 using any process known in art. In some embodiments, the landing pads can be formed by depositing the material and then etching the undesired portions of that material, thereby forming the landing pads with the desired shape. Of course, for the second landing pads 216, less material is etched so that the second landing pads 216 are formed to be larger than first landing pads 116, as illustrated in FIG. 3.

Next, as shown in FIG. 3, the first die 112 containing the first IC device is then attached to the first landing pads 116 using any known flip-chip process which does not use wire-bonding. One example of these processes includes solder bumping, which may include the use of solder bumps, balls, studs 122 (as shown in FIG. 4), and combinations thereof along with a solder paste, followed by a cure and reflow process. Another example of these processes includes the use of a conductive adhesive between the substrate terminals 116 and the first IC device. The conductive adhesive may be, for example, a conductive epoxy, a conductive film, a screen printable solder paste, or a solder material, such as a lead-containing solder or a lead-free solder.

Next, as shown in FIG. 4, the connectors 120 can then be formed on second landing pads 216, i.e., those which remain exposed after the first die 112 has been attached. This process can be performed using any known technique. In the embodiments illustrated in FIG. 4, the connectors 120 can be formed by mounting an array of connectors using any known conductive adhesives in the art. In other embodiments, the connectors 120 can be formed by stamping, etching, or a combination of both.

Figure 5:
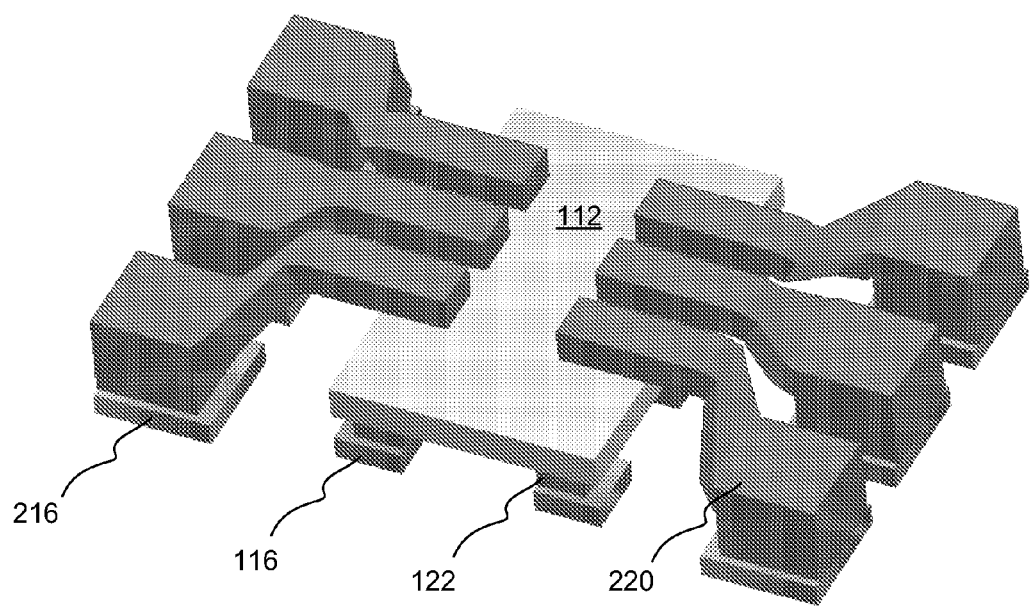
FIG. 5 shows other embodiments of the methods for manufacturing a semiconductor package containing connectors on the land pads.

The base segment 217 and the beam segment 218 of the connectors can be configured to accommodate a wide variety of die sizes and landing pad sizes. Another configuration for the connectors is depicted in FIG. 5 where the connectors 220 can be formed in a similar manner, but with a different configuration so that they can support a smaller upper die. This configuration generally has a portion of the connectors overlying the first die (i.e., the tip of the beam segments) and formed closer together. As well, the base segment of the connectors can be modified to match the underlying size and shape of the second landing pads 216, as well as made thicker to match thicker first dies (or thinner to match thinner dies). One skilled in the art will recognize that more or less land pads and/or connectors may be used as necessary for any other particular configuration.

Figure 6:
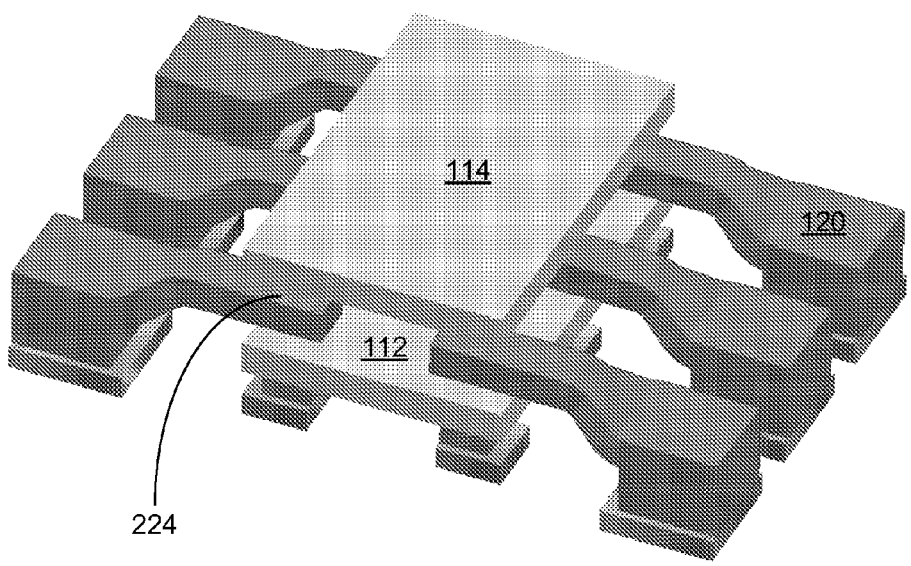
FIG. 6 shows some embodiments of the methods for manufacturing a semiconductor package containing a second die.

The second (or upper) die is then attached to the connectors. This process can be carried out using any known flip-chip process which does not use wirebonding. One example of these attachment processes include solder bumping, which may include the use of solder bumps, balls, studs 224 (as shown in FIG. 6), and combinations thereof along with a solder paste, followed by a cure and reflow process. Another example of these processes includes the use of a conductive adhesive between the connectors and the second die. The conductive adhesive may be, for example, a conductive epoxy, a conductive film, a screen printable solder paste, or a solder material, such as a lead-containing solder or a lead-free solder.

Figure 7:
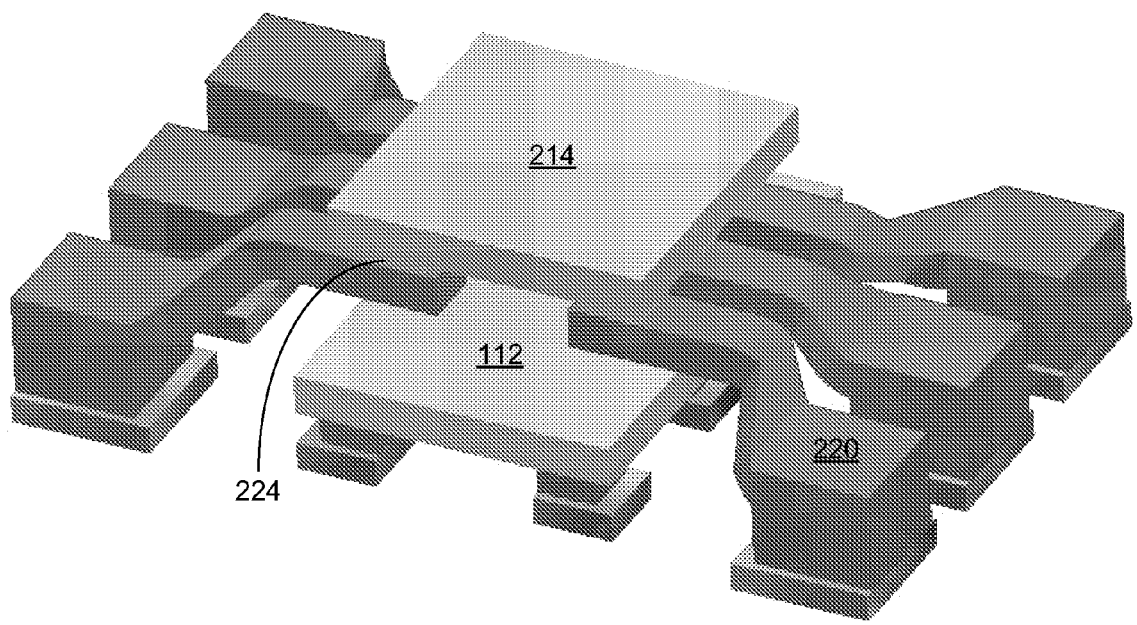
FIG. 7 depicts other embodiments of the methods for manufacturing a semiconductor package containing a second die.
Figure 8:
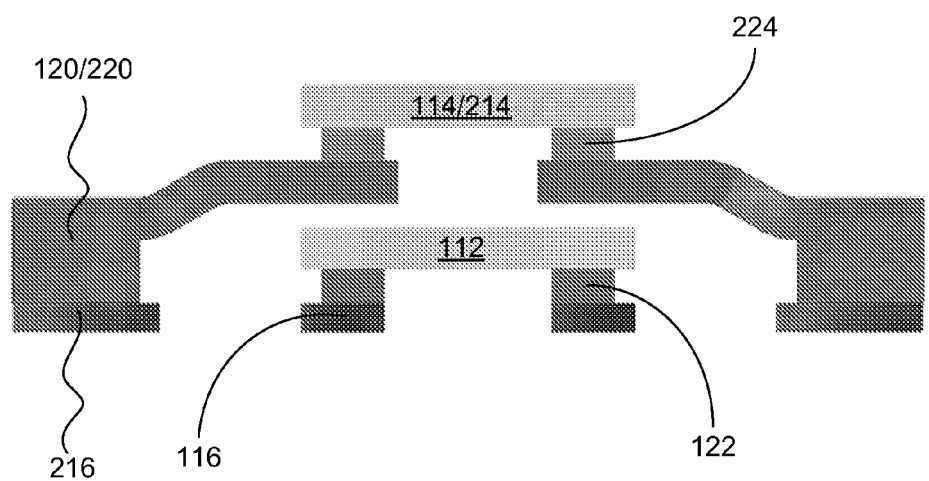
FIG. 8 illustrates a side view some embodiments of an isolated, stacked-die structure of the semiconductor packages before encapsulation.

The resulting structure after attaching the second die is shown in FIGS. 6-8. For the embodiments in FIG. 6 (where the second die 114 is substantially the same size as the first die 112), the second die 114 has been attached to the connectors 120. For the embodiments in FIG. 7 (where the second die is smaller than the first die), the second die 214 has been attached to the connectors 220. FIG. 8 depicts a side view of the structures illustrated in FIGS. 6-7 with studs 224 shown to connect the second die 114 to the connectors 120 (or 220) and studs 122 shown to connect the first die 112 to the inner landing pads 116.

After the second die has been attached to the desired connectors, a molding material 130 can then be formed around the land pads 116 and 216, first and second dies, and the connectors by any known encapsulation process, including potting, transfer molding, or injection. In some embodiments, the encapsulation process does not require any underfill. The resulting semiconductor package (such as those illustrated in FIGS. 1-2) is then optionally marked, trimmed, formed, and singulated using processes known in the art.

The semiconductor packages formed from this process contain two dies with IC devices that are stacked, yet which are isolated from each other because the molding material is contained between them. This configuration serves to separates the dies from each other. In this configuration, since there is no direct contact between the dies, their respective thermal stability is easier to maintain and heat is dissipated quicker.

The above semiconductor packages have a reduced size while at the same time also keeping the stacked dies isolated. In some embodiments, the thickness of the semiconductor packages can be less than about 1 mm. In other embodiments, the thickness of the semiconductor packages can range from about 0.8 mm to about 1 mm.

In some embodiments, the semiconductor packages can be configured to contain more than 2 stacked dies. The additional dies can be incorporated by including additional land pads on which additional connectors (120 or 220 depending on the size of the additional die) can be located. Then, the additional dies can be attached to the additional connectors by using a flip-chip process similar to those described above.

In some embodiments, this application relates to a method for manufacturing a semiconductor package by providing multiple land pads containing a first, central portion and a second, outer portion; connecting a first die to the first portion of the lands pads without wirebonding; connecting an array of connectors to the second portion of the land pads, the connectors comprising a base segment with an area substantially similar in size to the second portion of the land pads and that extends upwards from those land pads and a beam segment that extends from the base segment towards the area above the first die; connecting a second die substantially the same size or smaller than the first die to the array of connectors without wirebonding, wherein the second die is isolated from the first die; and encapsulating a molding material substantially encapsulating the connectors.

In some embodiments, this application relates to a method for manufacturing a semiconductor package having a thickness less than about 1 mm by providing a substrate; forming multiple land pads on the substrate by a deposition and etch procedure; connecting a first die to inner land pads by using a flip chip procedure without using wirebonding; connecting a second array of connectors to an outer land pads; connecting a second die to the second array of connectors by using a flip chip procedure without using wirebonding, wherein the second die rests on the connectors without contacting the first die; encapsulating a molding material around the connectors and the first and second dies without underfilling; and removing the substrate.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A method for making a semiconductor package, comprising:
    forming multiple land pads containing central lands pads and outer land pads;
    connecting a first die to the inner lands pads without wirebonding;

connecting an array of connectors to the outer land pads, the connectors comprising:
    a base segment with an area substantially similar in size to the outer land pads, the base segment extending upward from the outer land pads; and
    a beam segment extending from the base segment towards an area above the first die;
connecting a second die substantially the same size or smaller than the first die, the second die being connected to the array of connectors without wirebonding and wherein the second die is isolated from the first die; and
substantially encapsulating a molding material around the connectors.

2. The method of claim 1, wherein the first die contains a first integrated circuit device and the second die contains a second integrated circuit device.

3. The method of claim 1, wherein the second die does not contact the first die.

4. The method of claim 3, wherein the semiconductor package has a thickness less than about 1 mm.

5. The method of claim 4, wherein the semiconductor package has a thickness ranging from about 0.8 mm to about 1 mm.

6. The method of claim 1, wherein the second die is smaller than the first die.

7. The method of claim 1, further comprising encapsulating a single molding material encapsulating the connectors and the first and second dies.

8. The method of claim 1, wherein the multiple land pads terminate in terminals for the package.

9. The method of claim 1, wherein the molding material separates the first die from the second die.

10. The method of claim 1, wherein the beam segment does not contact the first die.

11. A method for making an electronic apparatus, comprising:
    making a semiconductor package by:
        forming multiple land pads containing central lands pads and outer land pads;
        connecting a first die to the inner lands pads without wirebonding;
        connecting an array of connectors to the outer land pads, the connectors comprising:
            a base segment with an area substantially similar in size to the outer land pads, the base segment extending upward from the outer land pads; and
            a beam segment extending from the base segment towards an area above the first die;
        connecting a second die substantially the same size or smaller than the first die,
        the second die being connected to the array of connectors without wirebonding
        and wherein the second die is isolated from the first die; and
        substantially encapsulating a molding material around the connectors; and
    connecting the semiconductor package to a printed circuit board.

12. The method of claim 11, wherein the first die contains a first integrated circuit device and the second die contains a second integrated circuit device.

13. The method of claim 11, wherein the second die does not contact the first die.

14. The method of claim 13, wherein the semiconductor package has a thickness less than about 1 mm.

15. The method of claim 14, wherein the semiconductor package has a thickness ranging from about 0.8 mm to about 1 mm.

16. The method of claim 11, wherein the second die is smaller than the first die.

17. The method of claim 11, further comprising encapsulating a single molding material encapsulating the connectors and the first and second dies.

18. The method of claim 11, wherein the multiple land pads terminate in terminals for the package.

19. The method of claim 11, wherein the molding material separates the first die from the second die.

20. The method of claim 11, wherein the beam segment does not contact the first die.

* * * * *